US008614497B2

(12) United States Patent
Xia et al.

(10) Patent No.: US 8,614,497 B2
(45) Date of Patent: Dec. 24, 2013

(54) METHOD FOR FABRICATING A MIM CAPACITOR USING GATE METAL FOR ELECTRODE AND RELATED STRUCTURE

(75) Inventors: Wei Xia, Irvine, CA (US); Xiangdong Chen, Irvine, CA (US); Akira Ito, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 136 days.

(21) Appl. No.: 12/462,692

(22) Filed: Aug. 7, 2009

(65) Prior Publication Data

US 2011/0031585 A1 Feb. 10, 2011

(51) Int. Cl.
*H01L 29/92* (2006.01)
(52) U.S. Cl.
USPC .................................. 257/532; 257/E29.343
(58) Field of Classification Search
USPC .................................. 438/253, 396
See application file for complete search history.

(56) References Cited

U.S. PATENT DOCUMENTS

| 5,652,172 | A | 7/1997 | Yung-Sung |
| 5,822,175 | A * | 10/1998 | Azuma ....................... 361/321.5 |
| 5,939,753 | A | 8/1999 | Ma |
| 6,420,222 | B1 | 7/2002 | Watanabe |
| 7,361,950 | B2 * | 4/2008 | Chinthakindi et al. ....... 257/301 |
| 2004/0048435 | A1 | 3/2004 | Kim |
| 2005/0250342 | A1 | 11/2005 | Ueda |
| 2006/0237795 | A1 | 10/2006 | Kato |
| 2007/0057343 | A1 | 3/2007 | Chinthakindi |
| 2007/0267705 | A1 * | 11/2007 | Won et al. ...................... 257/379 |
| 2008/0173978 | A1 * | 7/2008 | Tu ................................. 257/532 |
| 2008/0197398 | A1 | 8/2008 | Komukai |
| 2009/0090951 | A1 | 4/2009 | Chang |
| 2009/0095995 | A1 * | 4/2009 | Kawashima et al. ......... 257/296 |

FOREIGN PATENT DOCUMENTS

CN 1553497 12/2004

* cited by examiner

*Primary Examiner* — Seahvosh Nikmanesh
(74) *Attorney, Agent, or Firm* — Farjami & Farjami LLP

(57) ABSTRACT

According to one exemplary embodiment, a method for fabricating a MIM capacitor in a semiconductor die includes forming a dielectric one segment over a substrate and a metal one segment over the dielectric one segment, where the metal one segment forms a lower electrode of the MIM capacitor. The method further includes forming a dielectric two segment over the dielectric one segment and a metal two segment over the dielectric two segment, where a portion of the metal two segment forms an upper electrode of the MIM capacitor. The metal one segment comprises a first gate metal. The metal two segment can comprise a second gate metal.

20 Claims, 8 Drawing Sheets

US 8,614,497 B2

METHOD FOR FABRICATING A MIM CAPACITOR USING GATE METAL FOR ELECTRODE AND RELATED STRUCTURE

BACKGROUND OF THE INVENTION

1. Field of the Invention

The present invention is generally in the field of semiconductors. More particularly, the invention is in the field of fabrication of capacitors in semiconductor dies.

2. Background Art

Metal-insulator-metal (MIM) capacitors have been extensively utilized in the fabrication of integrated analog and mixed signal circuits on semiconductor dies. A MIM capacitor typically includes a MIM capacitor dielectric situated between lower and upper metal plates, which form the electrodes of the MIM capacitor. Conventionally, MIM capacitors can be fabricated on semiconductor dies during back-end-of-line (BEOL) processing.

A conventional MIM capacitor can be fabricated, for example, by inserting a specialized dielectric layer for a MIM capacitor dielectric and specialized metal layers for lower and upper MIM capacitor electrodes in the otherwise unused "vertical" space available between interconnect metal layers on a semiconductor die during BEOL processing. However, inserting the specialized dielectric and metal layers required to form the MIM capacitor dielectric and the bottom and upper MIM capacitor electrodes during BEOL processing can require multiple process steps and masks, which can undesirably increase manufacturing cost.

SUMMARY OF THE INVENTION

A method for fabricating a MIM capacitor using gate metal for electrode and related structure are provided. Features, advantages and various embodiments of the present invention are shown in and/or described in connection with at least one of the drawings, as set forth more completely in the claims.

DETAILED DESCRIPTION OF THE INVENTION

The present invention is directed to a method for fabricating a MIM capacitor using gate metal for electrode and related structure. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

The drawings in the present application and their accompanying detailed description are directed to merely exemplary embodiments of the invention. To maintain brevity, other embodiments of the present invention are not specifically described in the present application and are not specifically illustrated by the present drawings.

Figure 1:
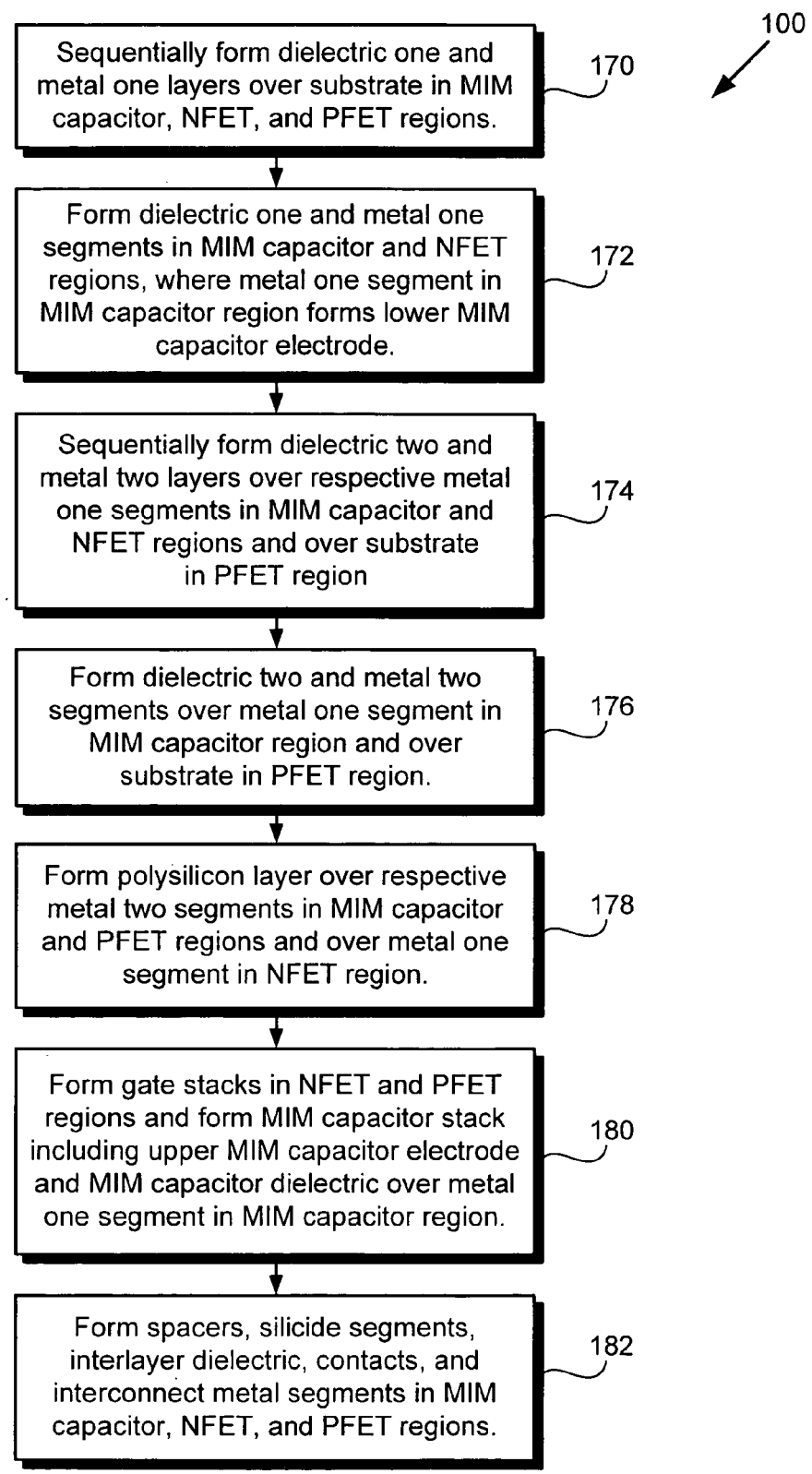
FIG. 1 shows a flowchart illustrating the steps taken to implement an embodiment of the present invention.

FIG. 1 shows a flow chart illustrating a method according to an embodiment of the present invention. Certain details and features have been left out of flowchart 100 that are apparent to a person of ordinary skill in the art. For example, a step may consist of one or more substeps or may involve specialized equipment or materials, as known in the art. Steps 170 through 182 indicated in flowchart 100 are sufficient to describe one embodiment of the present invention; however, other embodiments of the invention may utilize steps different from those shown in flowchart 100. It is noted that the processing steps shown in flowchart 100 are performed on a portion of processed wafer, which, prior to step 170, includes, among other things, a substrate, such as a silicon substrate, and isolation regions, such as shallow trench isolation (STI) regions, formed in MIM capacitor, N channel field effect transistor (NFET), and P channel FET (PFET) regions of the substrate. The wafer is also referred to simply as a wafer or a semiconductor die or simply a die in the present application.

Moreover, structures 270 through 282 in FIGS. 2A through 2G illustrate the result of performing steps 170 through 182 of flowchart 100, respectively. For example, structure 270 shows a semiconductor structure after processing step 170, structure 272 shows structure 270 after the processing of step 172, structure 274 shows structure 272 after the processing of step 174, and so forth.

Figure 2A:
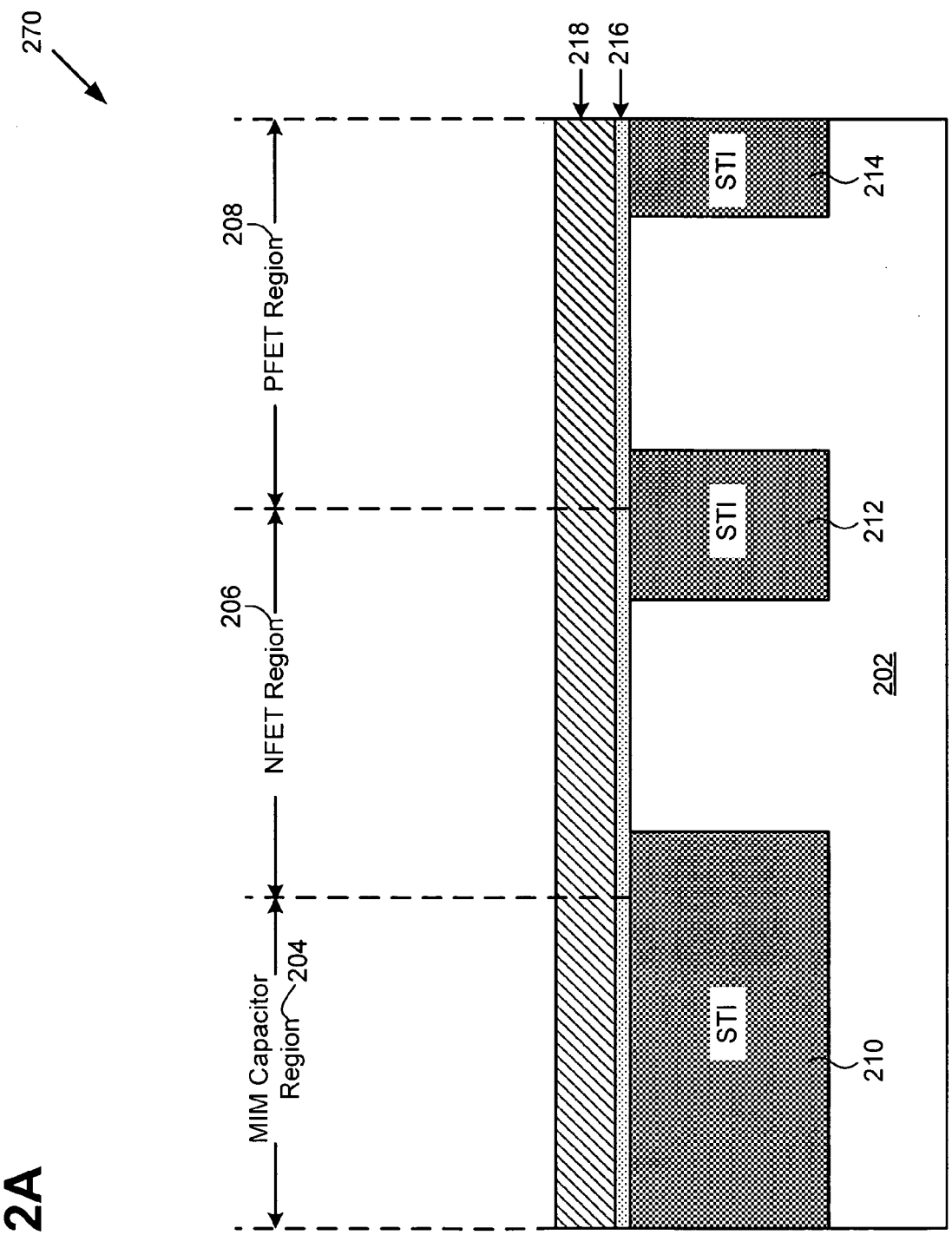
FIG. 2A illustrates a cross-sectional view, which includes a portion of a wafer processed according to an embodiment of the invention, corresponding to an initial step in the flowchart in FIG. 1.

Referring now to FIG. 2A, structure 270 of FIG. 2A shows a structure including a substrate, after completion of step 170 of flowchart 100 in FIG. 1. In structure 270, substrate 202, which can be a silicon substrate, includes MIM capacitor region 204, NFET region 206, and PFET region 208. MIM capacitor region 204, NFET region 206, and PFET region 208 are regions of substrate 202 that are designated for MIM capacitor, NFET (e.g. NMOSFET), and PFET (e.g. PMOSFET) formation, respectively. In structure 270, isolation regions 210, 212, and 214, which can be, for example, STI regions, are formed in substrate 202. Isolation regions 210, 212, and 214 can comprise silicon oxide or other dielectric material.

Continuing to refer to step 170 in FIG. 1 and structure 270 in FIG. 2A, at step 170 of flowchart 100, dielectric one layer 216 is formed over substrate 202 in MIM capacitor region 204, NFET region 206, and PFET region 208 and metal one layer 218 is formed over dielectric one layer 216. As shown in FIG. 2A, dielectric one layer 216 is situated over isolation regions 210, 212, and 214 and substrate 202. Dielectric one layer 216 can be, for example, a high dielectric constant (high-k) gate dielectric layer (e.g. a high-k dielectric layer that can be utilized for forming an NFET gate dielectric). Dielectric one layer 216 can comprise, for example, a metal oxide such as hafnium oxide (HfO$_2$), zirconium oxide (ZrO$_2$), or the like. Dielectric one layer 216 can be formed, for example, by depositing a high-k dielectric material, such as hafnium oxide or zirconium oxide, over substrate 202 by utilizing a physical vapor deposition (PVD) process, a chemical vapor deposition (CVD) process, or other deposition process.

Also shown in FIG. 2A, metal one layer 218 can comprise a gate metal, such as a gate metal for an NFET gate. In an embodiment of the invention, metal one layer 218 can comprise, for example, tantalum (Ta), tantalum nitride (TaN), titanium nitride (TiN), or other gate metal suitable for utilization in an NFET gate. As shown, metal one layer 218 is situated over dielectric one layer 216 in MIM capacitor region 204, NFET region 206, and PFET region 208. Metal one layer 218 can be formed, for example, by depositing a layer of tantalum, tantalum nitride, or titanium nitride over dielectric one layer 216 by utilizing a PVD process, a CVD process, or other deposition process. The result of step 170 of flowchart 100 is illustrated by structure 270 in FIG. 2A.

Figure 2B:
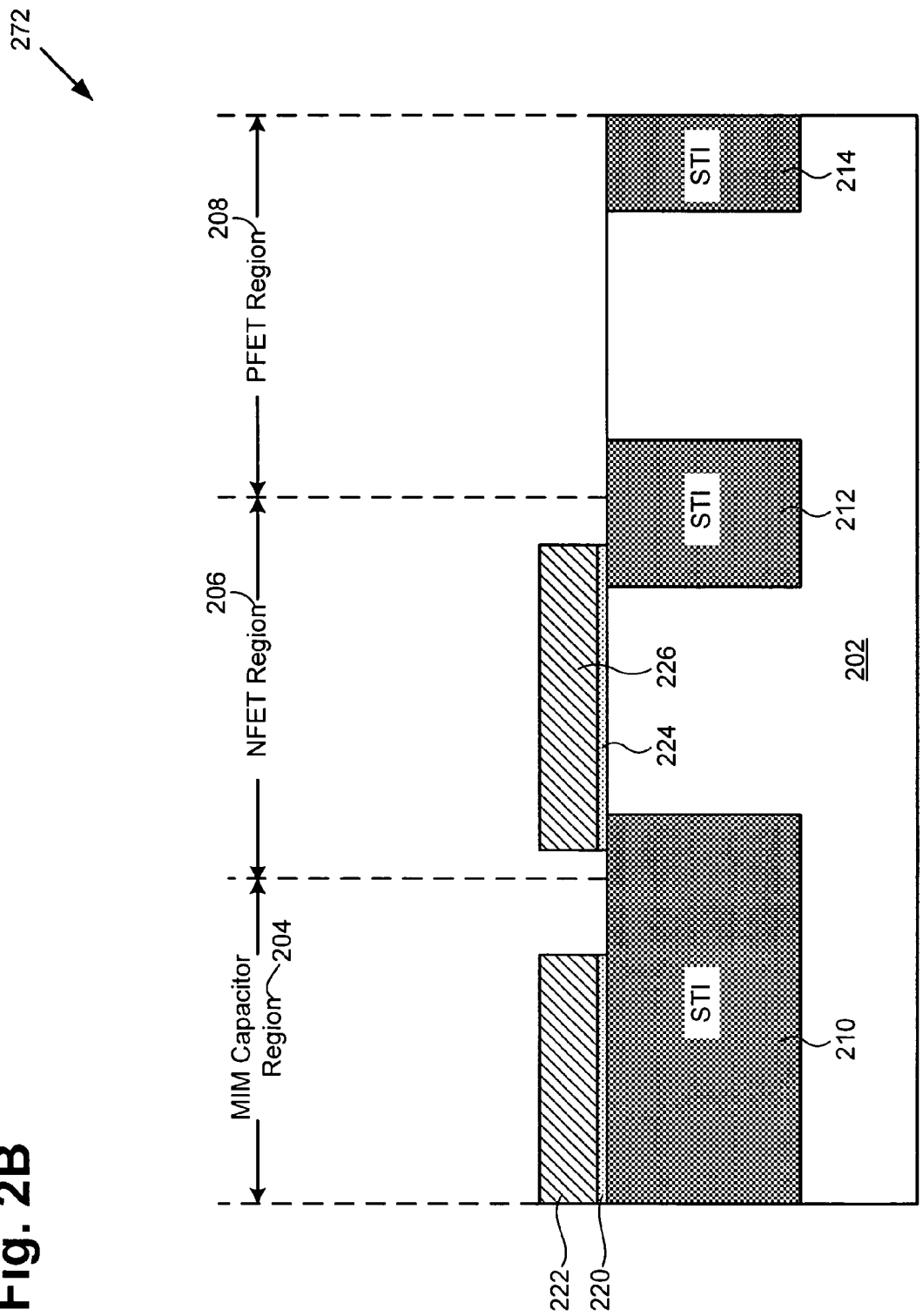
FIG. 2B illustrates a cross-sectional view, which includes a portion of a wafer processed according to an embodiment of the invention, corresponding to an intermediate step in the flowchart in FIG. 1.

Referring to step 172 in FIG. 1 and structure 272 in FIG. 2B, at step 172 of flowchart 100, dielectric one segment 220 and metal one segment 222 are formed in MIM capacitor region 204 and dielectric one segment 224 and metal one segment 226 are formed in NFET region 206. As shown in FIG. 2B, dielectric one segment 220 is situated over isolation region 210 and metal one segment 222 is situated over dielectric segment 220 in MIM capacitor region 204. Metal one segment 222 can form a bottom electrode of a MIM capacitor that will be subsequently formed in MIM capacitor region 204. Also shown in FIG. 2B, dielectric one segment 224 is situated over substrate 202 and isolation regions 210 and 212 and metal one segment 226 is situated over dielectric one segment 224 in NFET region 206. Dielectric one segments 220 and 224 and metal one segments 222 and 226 can be formed by, for example, appropriately patterning dielectric one layer 216 (shown in FIG. 2A) and metal one layer 218 (shown in FIG. 2A). During the patterning process, which can include a masking step and an etch step, metal one layer 218 and dielectric one layer 216 can be removed from PFET region 208. The result of step 172 of flowchart 100 is illustrated by structure 272 in FIG. 2B.

Figure 2C:
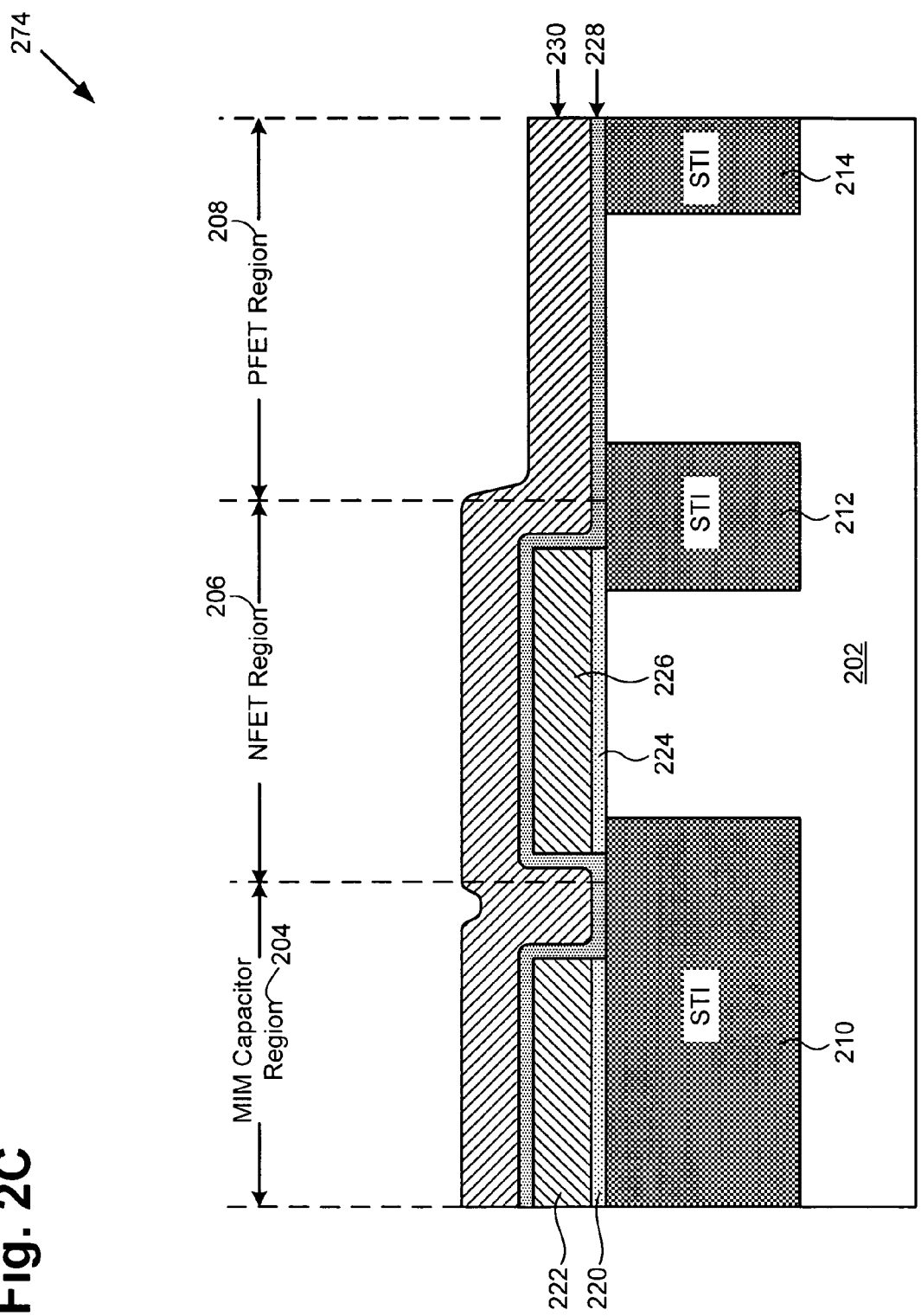
FIG. 2C illustrates a cross-sectional view, which includes a portion of a wafer processed according to an embodiment of the invention, corresponding to an intermediate step in the flowchart in FIG. 1.

Referring to step 174 in FIG. 1 and structure 274 in FIG. 2C, at step 174 of flowchart 100, dielectric two layer 228 is formed over substrate 202 in PFET region 208, over metal one segment 226 in NFET region 206, over metal one segment 222 in MIM capacitor region 204, and over isolation regions 210, 212, and 214 in substrate 202. As shown in FIG. 2C, dielectric two layer 228 is situated over isolation regions 210, 212, and 214, substrate 202 in PFET region 208, metal one segment 226 in NFET region 206, and metal one segment 222 in MIM capacitor region 204. Dielectric two layer 228 can be, for example, a high-k gate dielectric layer (e.g. a high-k dielectric layer that can be utilized for forming an PFET gate dielectric). In an embodiment of the invention, dielectric two layer 228 can comprise, for example, a metal oxide such as hafnium oxide, zirconium oxide, or the like. In one embodiment, dielectric two layer 228 can comprise the same dielectric material as dielectric one layer 216. In another embodiment, dielectric two layer 228 can comprise a different dielectric material than dielectric one layer 216. Dielectric two layer 228 can be formed, for example, by conformally depositing a high-k dielectric material, such as hafnium oxide or zirconium oxide, over substrate 202 by utilizing a PVD process, a CVD process, or other deposition process.

Also shown in FIG. 2C, metal two layer 230 can comprise a gate metal, such as a gate metal for a PFET gate. In an embodiment of the invention, metal two layer 230 can comprise, for example, molybdenum (Mo), ruthenium (Ru), tantalum carbide nitride (TaCN), or other metal suitable for utilization in a PFET gate. As shown, metal two layer 230 is situated over dielectric two layer 228 in MIM capacitor region 204, NFET region 206, and PFET region 208. Metal two layer 230 can be formed, for example, by conformally depositing a layer of metal, such as molybdenum, ruthenium, or tantalum carbide nitride, over dielectric one layer 216 by utilizing a PVD process, a CVD process, or other deposition process. Metal two layer 230 can comprise a metal having a different workfunction compared to the metal in metal one layer 218 (shown in FIG. 2A). The result of step 174 of flowchart 100 is illustrated by structure 274 in FIG. 2C.

Figure 2D:
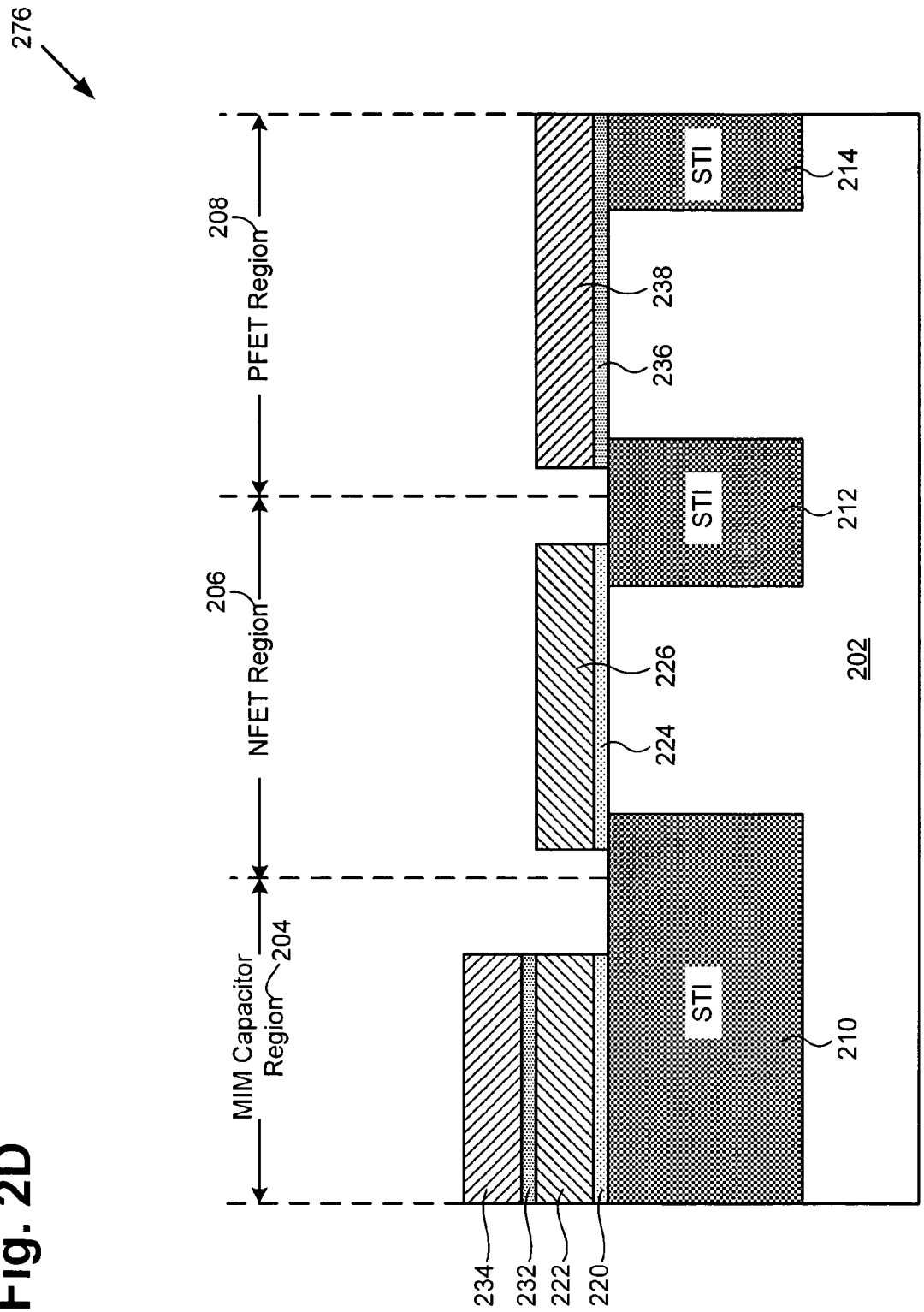
FIG. 2D illustrates a cross-sectional view, which includes a portion of a wafer processed according to an embodiment of the invention, corresponding to an intermediate step in the flowchart in FIG. 1.

Referring to step 176 in FIG. 1 and structure 276 in FIG. 2D, at step 176 of flowchart 100, dielectric two segment 232 and metal two segment 234 are formed over metal one segment 222 in MIM capacitor region 204 and dielectric two segment 236 and metal two segment 238 are formed over substrate 202 in PFET region 208. As shown in FIG. 2D, dielectric two segment 232 is situated over metal one segment 222 and metal two segment 234 is situated over dielectric two segment 232 in MIM capacitor region 204. Also shown in FIG. 2D, dielectric two segment 236 is situated over substrate 202 and isolation regions 212 and 214 and metal two segment 238 is situated over dielectric two segment 236 in PFET region 208. Dielectric two segments 232 and 236 and metal two segments 234 and 238 can be formed, for example, by appropriately patterning dielectric two layer 228 (shown in FIG. 2C) and metal two layer 230 (shown in FIG. 2C). During the patterning process, which can include a masking step and an etch step, metal two layer 230 and dielectric one layer 228 can be removed from NFET region 206 in the etch step. The result of step 176 of flowchart 100 is illustrated by structure 276 in FIG. 2D.

Figure 2E:
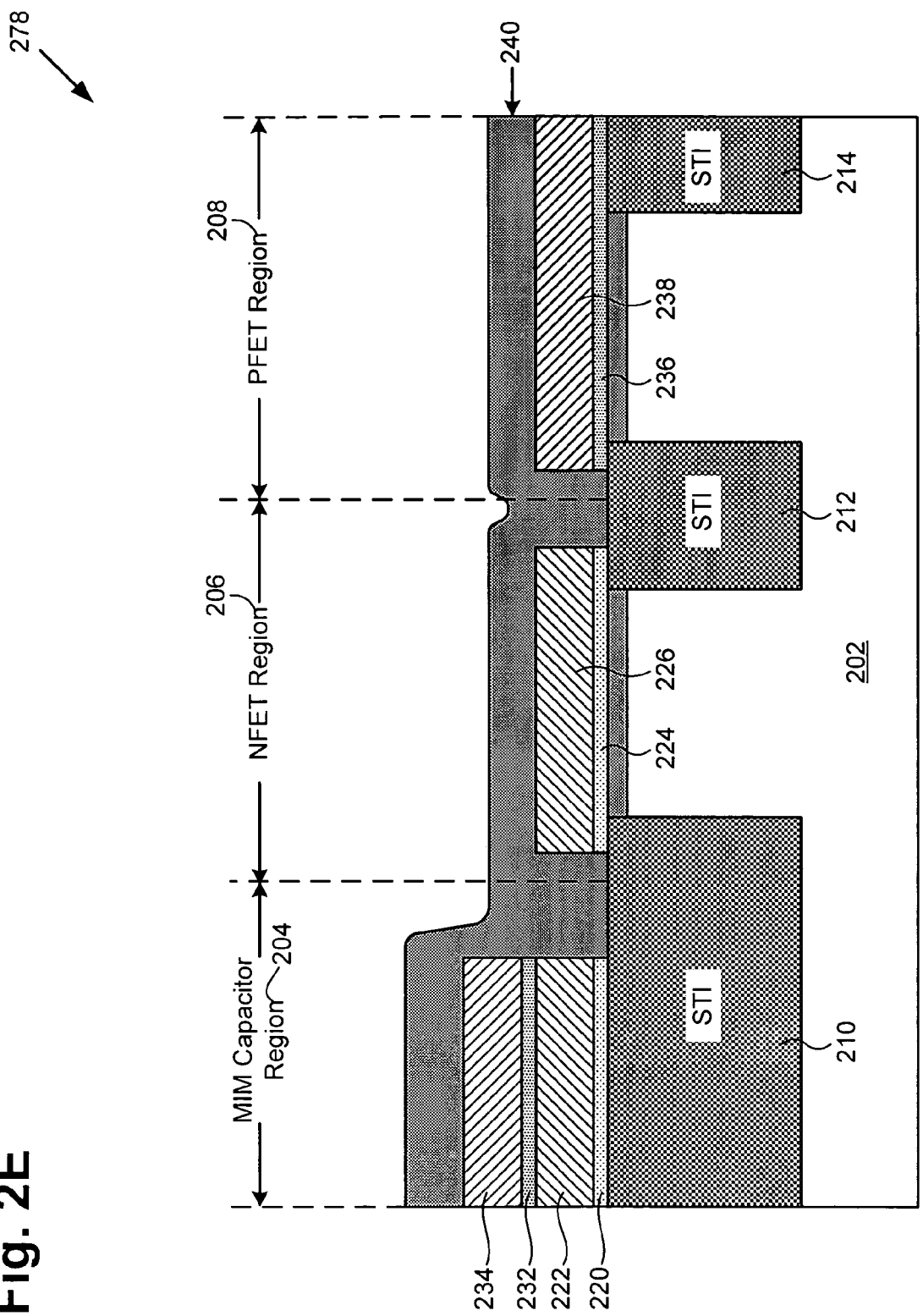
FIG. 2E illustrates a cross-sectional view, which includes a portion of a wafer processed according to an embodiment of the invention, corresponding to an intermediate step in the flowchart in FIG. 1.

Referring to step 178 in FIG. 1 and structure 278 in FIG. 2E, at step 178 of flowchart 100, polysilicon layer 240 is formed over metal two segment 234 in MIM capacitor region 204, over metal one segment 226 NFET region 206, and over metal two segment 238 in PFET region 208. Polysilicon layer 240 is also formed over isolation region 210 in MIM capacitor region 204 and NFET region 206 and over isolation region 212 in NFET region 206 and PFET region 208. As shown in FIG. 2E, polysilicon layer 240 is situated over metal two segment 234, isolation region 210, metal one segment 226, isolation region 212, and metal two segment 238. Polysilicon layer 240 can comprise polysilicon and can be utilized for gate formation in NFET region 206 and PFET region 208 and for MIM capacitor formation in MIM capacitor region 204. Polysilicon layer 240 can be formed, for example, by conformally depositing a layer of polysilicon in MIM capacitor region 204, NFET region 206, and PFET region 208 by utilizing a low pressure chemical vapor deposition (LPCVD) process or other suitable deposition process. The result of step 178 of flowchart 100 is illustrated by structure 278 in FIG. 2E.

Figure 2F:
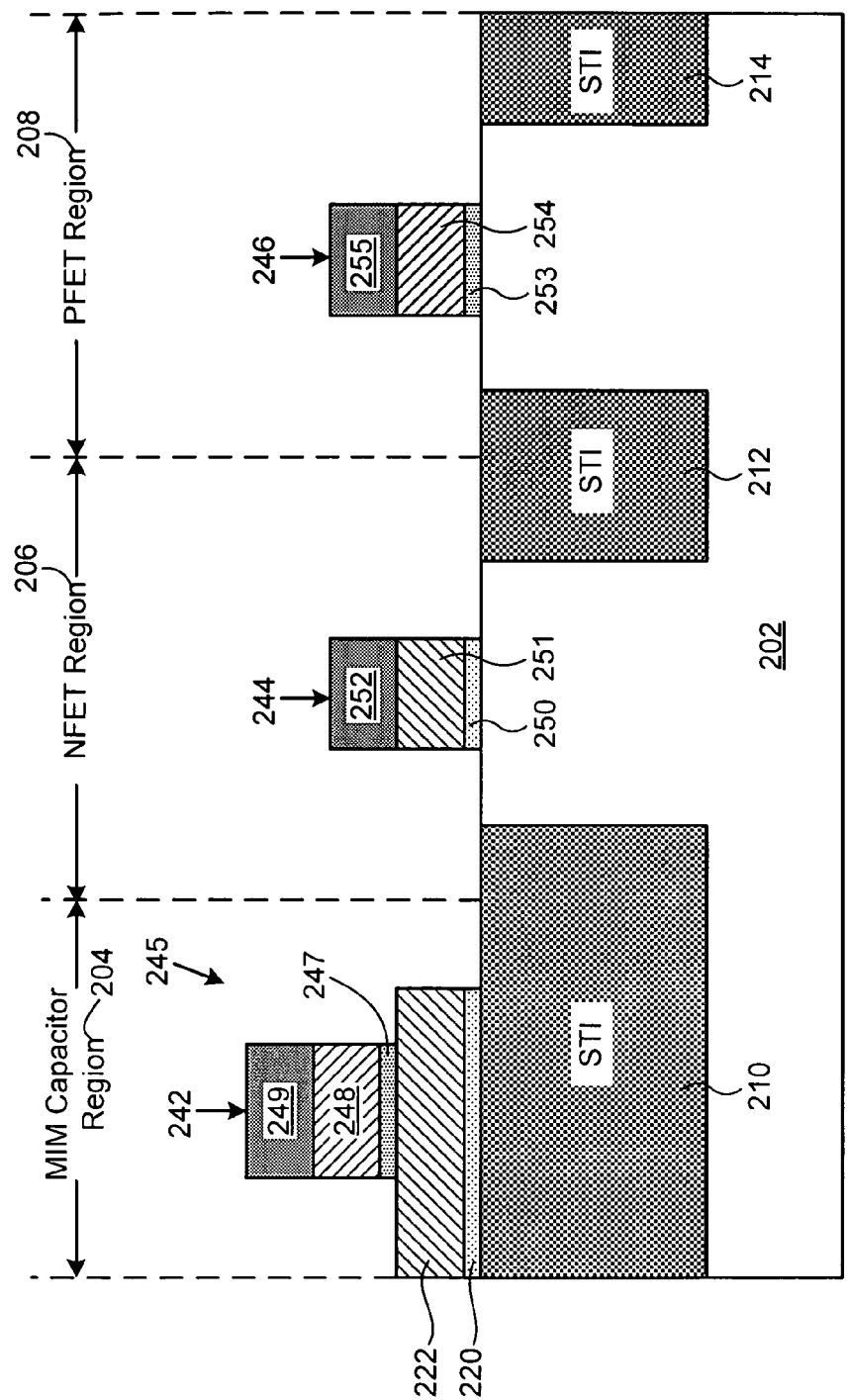
FIG. 2F illustrates a cross-sectional view, which includes a portion of a wafer processed according to an embodiment of the invention, corresponding to an intermediate step in the flowchart in FIG. 1.

Referring to step 180 in FIG. 1 and structure 280 in FIG. 2F, at step 180 of flowchart 100, NFET gate stack 244 is formed in NFET region 206, PFET gate stack 246 is formed in PFET region 208, and MIM capacitor stack 242 is formed in MIM capacitor region 204, where MIM capacitor stack 242 includes an upper MIM capacitor electrode and a MIM capacitor dielectric. MIM capacitor stack 242 includes dielectric two portion 247, which is a portion of dielectric two segment 232 (shown in FIG. 2E), metal two portion 248, which is a portion of metal two segment 234 (shown in FIG. 2E), and polysilicon segment 249. As shown in FIG. 2F, in MIM capacitor region 204, dielectric two portion 247 is situated over metal one segment 222, metal two portion 248 is situated over dielectric two portion 247, and polysilicon segment 249 is situated over metal two portion 248. As shown in FIG. 2F, dielectric two portion 247 forms a MIM capacitor dielectric of MIM capacitor 245 and metal two portion 248 forms an upper electrode of MIM capacitor 245. Also, metal one segment 222, which was formed at step 172 of flowchart 100, forms a lower electrode of MIM capacitor 245.

Also shown in FIG. 2F, NFET gate stack 244 includes dielectric one portion 250, which is situated over substrate 202, metal one portion 251, which is situated over dielectric one portion 250, and polysilicon segment 252, which is situated over metal one portion 215. In NFET gate stack 244, dielectric one portion 250 forms an NFET gate dielectric and metal one portion 251 forms an NFET. Further shown in FIG. 2F, PFET gate stack 246 includes dielectric two portion 253, which is situated over substrate 202, metal two portion 254, which is situated over dielectric two portion 253, and polysilicon segment 255, which is situated over metal two portion 254. In PFET gate stack 246, dielectric two portion 253 forms a PFET gate dielectric and metal two portion 254 forms an PFET metal gate.

MIM capacitor stack 242 can be formed by appropriately patterning metal two segment 234 and dielectric two segment 232 (shown in FIG. 2D), NFET gate stack 244 can be formed by appropriately patterning metal one segment 226 and dielectric one segment 224 (shown in FIG. 2D), and PFET gate stack 246 can be formed by appropriately patterning metal two segment 238 and dielectric two segment 236 (shown in FIG. 2D). The patterning process utilized to form MIM capacitor stack 242, NFET gate stack 244, and PFET gate stack 246 can include a masking step and an etching step. The result of step 180 of flowchart 100 is illustrated by structure 280 in FIG. 2F.

Figure 2G:
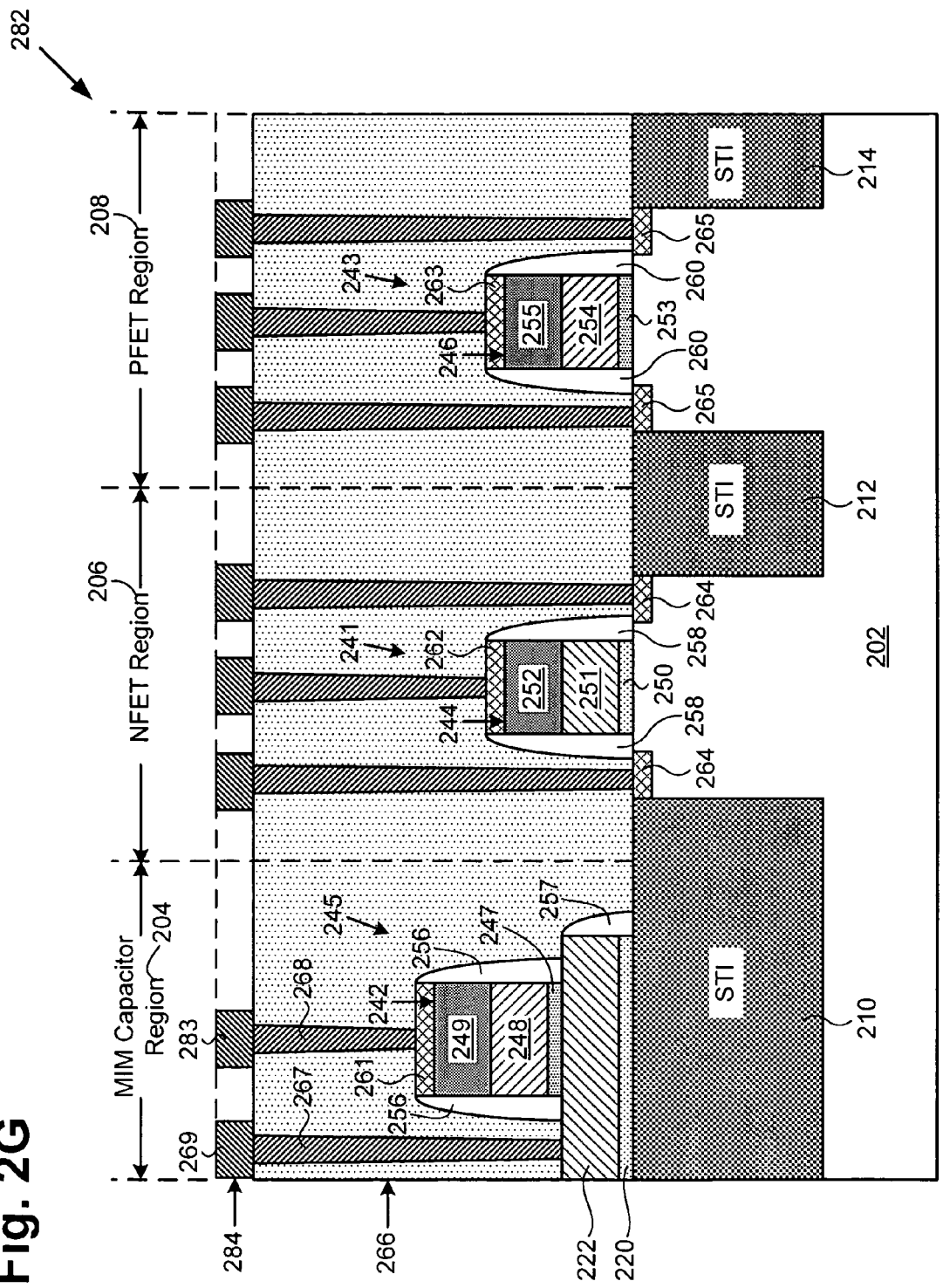
FIG. 2G illustrates a cross-sectional view, which includes a portion of a wafer processed according to an embodiment of the invention, corresponding to a final step in the flowchart in FIG. 1.

Referring to step 182 in FIG. 1 and structure 282 in FIG. 2G, at step 182 of flowchart 100, spacers 256 and 257, silicide segment 261, contacts 267 and 268, and interconnect metal segments 269 and 283 are formed in MIM capacitor region 204; spacers 258, silicide segments 262 and 264, and contacts and interconnect metal segments are formed in NFET region 206; spacers 260, silicide segments 263 and 265, and contacts and interconnect metal segments are formed in PFET region 208; and interlayer dielectric 266 is formed in MIM capacitor region 204, NFET region 206 and PFET region 208. Also at step 182 of flowchart 100, source/drain regions (not shown in FIG. 2G) are formed in substrate 202 adjacent to NFET gate stack 244 in NFET region 206 and adjacent to PFET gate stack 246 in PFET region 208.

As shown in FIG. 2G, spacers 256 are situated adjacent to respective sides of MIM capacitor stack 242, spacer 257 is situated adjacent to metal one segment 222 and dielectric one segment 220, spacers 258 are situated adjacent to respective sides of NFET gate stack 244, and spacers 260 are situated adjacent to respective sides of PFET gate stack 246. Spacers 256, 257, 258, and 260 can comprise silicon oxide or other dielectric material as known in the art. Spacers 256, 257, 258, and 260 can be formed, for example, by conformally depositing a layer of dielectric material, such as silicon oxide, over MIM capacitor stack 242, metal one segment 222, NFET gate stack 244, and PFET gate stack 246, by utilizing a CVD process or other deposition process and appropriately etching the layer of dielectric material in an etch-back process.

Also shown in FIG. 2G, silicide segment 261 is situated on polysilicon segment 249 of MIM capacitor stack 242, silicide segment 262 is situated on polysilicon segment 252 in NFET gate stack 244, silicide segments 264 are situated on substrate 202 adjacent to NFET gate stack 244, silicide segment 263 is situated on polysilicon segment 255 in PFET gate stack 246, and silicide segments 265 are situated on substrate 202 adjacent to PFET gate stack 246. It is noted that the silicide segments can extend into the feature on which they are formed. Thus, for example, silicide segment 261 can extend into polysilicon segment 249 of MIM capacitor stack 242. Silicide segments 261, 262, 263, 264, and 265 can comprise a metal silicide, such as, for example, nickel silicide or cobalt silicide, and can be formed in a manner known in the art. Further shown in FIG. 2G, interlayer dielectric 266 is situated over MIM capacitor 245, NFET gate stack 244, PFET gate stack 246, isolation regions 210, 212, and 214, and substrate 202. Interlayer dielectric 266 can comprise silicon oxide or other dielectric material and can be formed, for example, by utilizing a CVD process or other deposition process to deposit a layer of dielectric material, such as silicon oxide, over MIM capacitor 245, NFET gate stack 244, PFET gate stack 246, isolation regions 210, 212, and 214, and substrate 202.

Also shown in FIG. 2G, contact 267 is situated on metal one segment 222 of MIM capacitor 245 and contact 268 is situated on silicide segment 261 of MIM capacitor 245. Contacts, such as contacts 267 and 268 can be formed in interlayer dielectric 266 by etching a contact via in interlayer dielectric 266 and filling the contact via with tungsten or other metal or metal stack as is known in the art. Further shown in FIG. 2G, interconnect metal segment 269 is situated on contact 267, interconnect metal segment 283 is situated on contact 268, and interconnect metal segments 269 and 283 are also situated over interlayer dielectric 266. Interconnect metal segments 269 and 283 are situated in interconnect metal layer 284, which can be a first interconnect metal layer in the semiconductor die. Interconnect metal segments 269 and 283 can comprise, for example, a metal such as aluminum or copper and can be formed by depositing and patterning a layer of metal over interlayer dielectric 266 in a manner known in the art.

As shown in FIG. 2G, interconnect metal segment 269 is electrically connected by contact 267 to metal one segment 222, which forms the lower electrode of MIM capacitor 245. Thus, interconnect metal segment 269 provides electrical connectivity to the lower electrode of MIM capacitor 245. Also shown in FIG. 2G, interconnect metal segment 283 is electrically connected by contact 268 to silicide segment 261, which is electrically connected by polysilicon segment 249 to metal two portion 248, which forms the upper electrode of MIM capacitor 245. Thus, interconnect metal segment 283 provides electrical connectivity to the upper electrode of MIM capacitor 245. Thus, as further shown in FIG. 2G, NFET 241 and PFET 243 are formed, where NFET 241 (e.g. an NMOSFET) includes NFET gate stack 244 and source/drain regions (not shown in FIG. 2G) and PFET 243 (e.g. a PMOSFET) includes PFET gate stack 246 and source/drain regions (not shown in FIG. 2G).

Also, as shown in FIG. 2G, MIM capacitor 245 is situated between interconnect metal layer 284 (i.e. a first interconnect metal layer in the semiconductor die) and substrate 202. Thus, the lower and upper electrodes of MIM capacitor 245 do not overlie an interconnect metal layer in the semiconductor die. It is noted that in FIG. 2G, only contacts 267 and 268 and interconnect metal segments 269 and 283 are specifically discussed herein to preserve brevity. The result of step 182 of flowchart 100 is illustrated by structure 282 in FIG. 2G.

In an embodiment of the invention shown in FIGS. 2A through 2G, MIM capacitor stack 242 corresponds to PFET gate stack 246. Thus, metal two portion 248 of MIM capacitor stack 242 (i.e. the upper electrode of MIM capacitor 245) can comprise the same gate metal as the metal gate in PFET gate stack 246. Also, in the embodiment of the invention shown in FIGS. 2A through 2G, metal one segment 222 (i.e. the lower electrode of MIM capacitor 245) can comprise the same gate metal as the metal gate in NFET gate stack 244. However, in another embodiment, the process for forming MIM capacitor 245, NFET gate stack 244, and PFET gate stack 246 and be performed in a different order, wherein MIM capacitor stack 242 can correspond to NFET gate stack 244. Thus, in such embodiment, the upper electrode of MIM capacitor 245 can comprise the same gate metal as the metal gate in NFET gate stack 244 and the lower electrode of MIM capacitor 245 can comprise the same gate metal as the metal gate in PFET gate stack 246.

By utilizing a high-k gate dielectric material for a MIM capacitor dielectric and gate metal for lower and upper MIM capacitor electrodes, the process for forming an embodiment of the invention's MIM capacitor 245 is compatible with a high-k metal gate process for advanced process technologies, such as 45.0 nanometer (nm) and smaller process technologies. Also, by utilizing a high-k gate dielectric material for a MIM capacitor dielectric and gate metal for lower and upper MIM capacitor electrodes, an embodiment of the invention's MIM capacitor 245 can provide a capacitance density greater than approximately 20.0 femtofarads (fF)/um$^2$, thereby advantageously reducing MIM capacitor die area.

By forming a MIM capacitor in a MIM capacitor region of a substrate while concurrently forming an NFET gate stack in an NFET region of the substrate and a PFET gate stack in a PFET region of the substrate, an embodiment of the present invention can advantageously form a MIM capacitor (e.g. MIM capacitor 245) without requiring any additional masks other than the masks required to form the NFET and PFET gate stacks. Also, by forming a MIM capacitor concurrently with NFET and PFET gate stacks, the capacitance of an embodiment of the invention's MIM capacitor is easier to control compared to the capacitance of a conventional MIM capacitor that is formed between interconnect metal layers in a semiconductor die during BEOL processing.

Thus, as discussed above, the present invention provides a MIM capacitor that utilizes gate metal for upper and lower electrodes and a gate dielectric material, such as a high-k gate dielectric material, for a MIM capacitor dielectric. As such, the invention's MIM capacitor can be advantageously formed concurrently with NFET and PFET gate stacks without requiring an additional mask other than the masks required to form the NFET and PFET gate stacks. By not requiring an additional mask, the present invention provides a MIM capacitor that can be fabricated at a significantly lower cost compared to a conventional MIM capacitor that is fabricated interconnect metal layers in a semiconductor die during BEOL processing. Also, the present invention provides a MIM capacitor having a capacitance that is easier to control compared to the capacitance of a conventional MIM capacitor.

From the above description of the invention it is manifest that various techniques can be used for implementing the concepts of the present invention without departing from its scope. Moreover, while the invention has been described with specific reference to certain embodiments, a person of ordinary skill in the art would appreciate that changes can be made in form and detail without departing from the spirit and the scope of the invention. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

The invention claimed is:

1. A MIM capacitor in a semiconductor die, said MIM capacitor comprising:
    a lower electrode of said MIM capacitor situated over a substrate, said lower electrode of said MIM capacitor comprising a first gate metal;
    a MIM capacitor dielectric situated over said lower electrode of said MIM capacitor;
    an upper electrode of said MIM capacitor situated over said MIM capacitor dielectric, wherein said MIM capacitor dielectric and said upper electrode are laterally substantially coextensive;
    a first gate stack comprising said first gate metal laterally spaced apart from said MIM capacitor; and
    a second gate stack comprising a second gate metal laterally spaced apart from said MIM capacitor and said first gate stack;
    wherein said first gate metal is different from said second gate metal.

2. The MIM capacitor of claim 1, wherein said upper electrode of said MIM capacitor comprises said second gate metal.

3. The MIM capacitor of claim 2, wherein said first gate metal comprises an NFET gate metal.

4. The MIM capacitor of claim 1, wherein said lower electrode of said MIM capacitor is situated over an isolation region in said substrate.

5. The MIM capacitor of claim 1 further comprising a polysilicon segment situated over said upper electrode of said MIM capacitor.

6. The MIM capacitor of claim 1 further comprising a high-k dielectric situated between said lower electrode of said MIM capacitor and said substrate.

7. The MIM capacitor of claim 1, wherein said MIM capacitor dielectric is a high-k dielectric.

8. The MIM capacitor of claim 1 further comprising spacers situated adjacent to respective sides of said upper electrode of said MIM capacitor.

9. The MIM capacitor of claim 5 further comprising a silicide segment situated on said polysilicon segment.

10. The MIM capacitor of claim 1, wherein said upper electrode of said MIM capacitor does not overlie an interconnect metal layer in said semiconductor die.

11. A MIM capacitor comprising:
    a first dielectric segment formed over a semiconductor substrate;
    a lower electrode of said MIM capacitor situated over said first dielectric segment, said lower electrode comprising a first gate metal;
    an upper electrode of said MIM capacitor situated over said lower electrode; and
    a MIM capacitor dielectric situated between said lower electrode and said upper electrode, wherein said MIM capacitor dielectric and said upper electrode are laterally substantially coextensive;
    a first gate stack comprising said first gate metal laterally spaced apart from said MIM capacitor; and
    a second gate stack comprising a second gate metal laterally spaced apart from said MIM capacitor and said first gate stack;

wherein said first gate metal is different from said second gate metal.

12. The MIM capacitor of claim 11, wherein said upper electrode comprises said second gate metal.

13. The MIM capacitor of claim 12, wherein said first gate metal comprises an NFET gate metal.

14. The MIM capacitor of claim 11, wherein said first dielectric segment is situated over an isolation region in said semiconductor substrate.

15. The MIM capacitor of claim 11 further comprising a polysilicon segment situated over said upper electrode.

16. The MIM capacitor of claim 11 wherein said first dielectric segment comprises a high-k dielectric.

17. The MIM capacitor of claim 11, wherein said MIM capacitor dielectric comprises a high-k dielectric.

18. The MIM capacitor of claim 11 further comprising spacers situated adjacent to respective sides of said upper electrode.

19. The MIM capacitor of claim 11 further comprising:
a polysilicon segment situated over said upper electrode; and
a silicide segment situated on said polysilicon segment.

20. The MIM capacitor of claim 11, wherein said upper electrode of said MIM capacitor does not overlie an interconnect metal layer in said semiconductor die.

* * * * *